US008957706B2

(12) United States Patent
Chen

(10) Patent No.: US 8,957,706 B2
(45) Date of Patent: Feb. 17, 2015

(54) DYNAMIC COMPARATOR WITH EQUALIZATION FUNCTION

(71) Applicant: Industrial Technology Research Institute, Hsinchu (TW)

(72) Inventor: Bo-Wei Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 13 days.

(21) Appl. No.: 13/727,533

(22) Filed: Dec. 26, 2012

(65) Prior Publication Data

US 2014/0084960 A1     Mar. 27, 2014

(30) Foreign Application Priority Data

Sep. 27, 2012  (TW) .............................. 101135481 A

(51) Int. Cl.
*H03K 5/22*          (2006.01)

(52) U.S. Cl.
USPC .............................................. 327/65; 327/55

(58) Field of Classification Search
USPC ................................... 327/55, 57, 65, 52, 67
See application file for complete search history.

(56) References Cited

U.S. PATENT DOCUMENTS

| | | | |
|---|---|---|---|
| 6,825,696 B2 | 11/2004 | Jaussi et al. | |
| 8,111,090 B2 | 2/2012 | Gebara et al. | |
| 2009/0108880 A1* | 4/2009 | Soltanian | 327/52 |
| 2009/0108881 A1* | 4/2009 | Wilson | 327/57 |

FOREIGN PATENT DOCUMENTS

CN          101839941 A     9/2010

OTHER PUBLICATIONS

Kobayashi et al., "A Current-Controlled Latch Sense Amplifier and a Static Power-Saving Input Buffer for Low-Power Architecture," IEEE J. of Sold-State Circuits, vol. 28, No. 4, pp. 523-527 (Apr. 4, 1993).
Schinkel et al., "A Double-Tail Latch-Type Voltage Sense Amplifier with 18ps Setup+Hold Time," IEEE Int'l Solid-State Conference, ISSCC 2007, Session 17, pp. 314-315 (Feb. 2007).
Goll et al., "A 0.12μm CMOS Comparator Requiring 0.5V at 600MHz and 1.5V at 6GHz," IEEE Int'l Solid-State Conference, ISSCC 2007, Session 17, pp. 316-317 (Feb. 2007).

(Continued)

*Primary Examiner* — Quan Tra
(74) *Attorney, Agent, or Firm* — Muncy, Geissler, Olds & Lowe, P.C.

(57) ABSTRACT

The present disclosure provides a dynamic comparator with equalization function including a preamplifier, switched latch and dynamic transconductance circuit. The preamplifier amplifies input signals of the dynamic comparator. The dynamic transconductance circuit is inserted between the preamplifier and the switched latch for operating in a reset mode or a comparison mode. When operating in the reset mode, the dynamic transconductance circuit in conjunction with the switched latch performs voltage equalization of output signals of the switched latch, or when operating in the comparison mode, the dynamic transconductance circuit in conjunction with the switched latch receives the output signals generated by the preamplifier and carries out signal transconductance. The switched latch generates output signals as a comparison result of the dynamic comparator based on the transconductance signals generated by the dynamic transconductance circuit. The present disclosure provides a dynamic comparator that reduces the power consumption and increasing the operating speed.

8 Claims, 5 Drawing Sheets

(56) References Cited

OTHER PUBLICATIONS

Miyahara et al., "A Low-Noise Self-Calibrating Dynamic Comparator for High-Speed ADCs," IEEE Asian Solid-State Circuits Conf., pp. 269-272 (Nov. 2008).
Goll et al., "A 65nm CMOS Comparator with Modified Latch to Achieve 7GHz/1.3mW at 1.2V and 700 MHz/47μW at 0.6V," IEEE Int'l Solid-State Conference, ISSCC 2009, Session 19, pp. 328-329 (Feb. 2009).
Goll et al., "A Comparator with Reduced Delay Time in 65-nm CMOS for Supply Voltages Down to 0.65 V," IEEE Trans. On Circuits and Systems, vol. 56, No. 11, pp. 810-814 (Nov. 2009).

* cited by examiner

DYNAMIC COMPARATOR WITH EQUALIZATION FUNCTION

CROSS-REFERENCE TO RELATED APPLICATIONS

This application claimed priority to Taiwanese Patent Application No. 101135481, filed on Sep. 27, 2012. The entirety of the above-mentioned patent application is hereby incorporated by reference herein and made a part of this specification.

BACKGROUND

1. Technical Field

The present invention relates to dynamic comparators, and, more particularly, to a dynamic comparator with equalization function.

2. Description of Related Art

Comparators that compare the difference between input signals and output the result of the comparison have been widely used in electronic equipment or electronic devices.

For example, a general dynamic comparator is dynamically switched between reset and comparing mode. The dynamic comparator comprises a preamplifier and a switched latch. The preamplifier is used to amplify input signals and applies its output signals to the switched latch, so that the sensitivity of the comparator can be improved. The switched latch receives the output signals of the preamplifier and performs signal regeneration. The performance of a comparator can be evaluated based on power consumption and operating speed, and a method of quantifying performance is based on the energy consumption of the comparator (in units of Joules), that is, the power consumption divided by operating speed.

Kobayashi et al. disclosed a comparator structure in IEEE JSSC'93. The comparator structure has the characteristics of a high-impedance input, but its high transistor stack limits the supply voltage, and the size of the tail current is determined by only one transistor, resulting in the design trade-off between speed and accuracy. Moreover, the speed and accuracy of this architecture is more sensitive to input common-mode variation.

A double-tail comparator structure proposed by Schinkel et al. in IEEE ISSCC'07 reduces the stack number of the transistors from four transistors to three transistors, allowing the supply voltage to be further reduced. Also, based on the double-tail structure, the operating speed and accuracy of the comparator can be optimized respectively. For example, the tail current of the first stage in the comparator can be used for accuracy optimization, and the other tail current for the second-stage can be used for speed optimization. Therefore, the speed and the accuracy of the comparator can be insensitive to input common-mode variation.

In order to further enhance the operation speed of the comparator, a comparator structure disclosed in U.S. Pat. No. 8,111,090 can be adopted, that is, equalization function is added. As such, the operating speed of the comparator can be enhanced. It is worth mentioning that such equalization function needs to be provided in the structure of a static circuit. In other words, the comparator includes DC power consumption.

In this regard, there is a need for a comparator with low power consumption and high speed operation based on equalization techniques have no DC power consumption and, in particular, does not compromise the accuracy of the comparator.

SUMMARY

The present disclosure provides a dynamic comparator with equalization function that equalizes the bias voltages of output terminals thereof.

Also, the present disclosure provides a dynamic comparator with equalization function that reduces the recovery time of output common-mode voltage in the comparison mode according to the equalized voltage generated during equalization.

The present disclosure provides a dynamic comparator with equalization function including a preamplifier, switched latch and dynamic transconductance circuit. The preamplifier is used to amplify input signals and generate output signals. The dynamic transconductance circuit is inserted between the preamplifier and the switched latch for operating at reset or comparison mode. Operating at reset mode, the dynamic transconductance circuit in conjunction with the switched latch performs voltage equalization of output signals of the switched latch. When operating at comparison mode, the dynamic transconductance circuit in conjunction with the switched latch receives the output signals generated by the preamplifier and carries out signal transconductance. The switched latch then generates output signals based on the transconductance signals generated by the dynamic transconductance circuit, wherein the output signals is as a comparison result of the dynamic comparator.

Compared to the prior art, the present disclosure provides a dynamic equalizer which resolves DC power consumption problem in traditional static equalizer. In the dynamic comparator with dynamic equalization function according to the present disclosure, the dynamic transconductance circuit can perform equalization in the reset mode, such that the bias voltages of the two output terminals of the dynamic comparator are equalized to a balanced state without the need for additional direct current, thereby have no static power consumption. Operating at comparison mode, the dynamic transconductance circuit is switched to perform transconductance, that is, convert signal from voltage to current. Since the two output terminals of the dynamic comparator are already biased to specific voltages under the reset mode, it requires less recovery time to reach the output common-mode voltage condition before signal regeneration. Thus, the operating speed of the dynamic comparator is enhanced.

BRIEF DESCRIPTION OF DRAWINGS

The present invention can be more fully understood by reading the following detailed description of the preferred embodiments, with reference made to the accompanying drawings, wherein.

DETAILED DESCRIPTION

Figure 1:
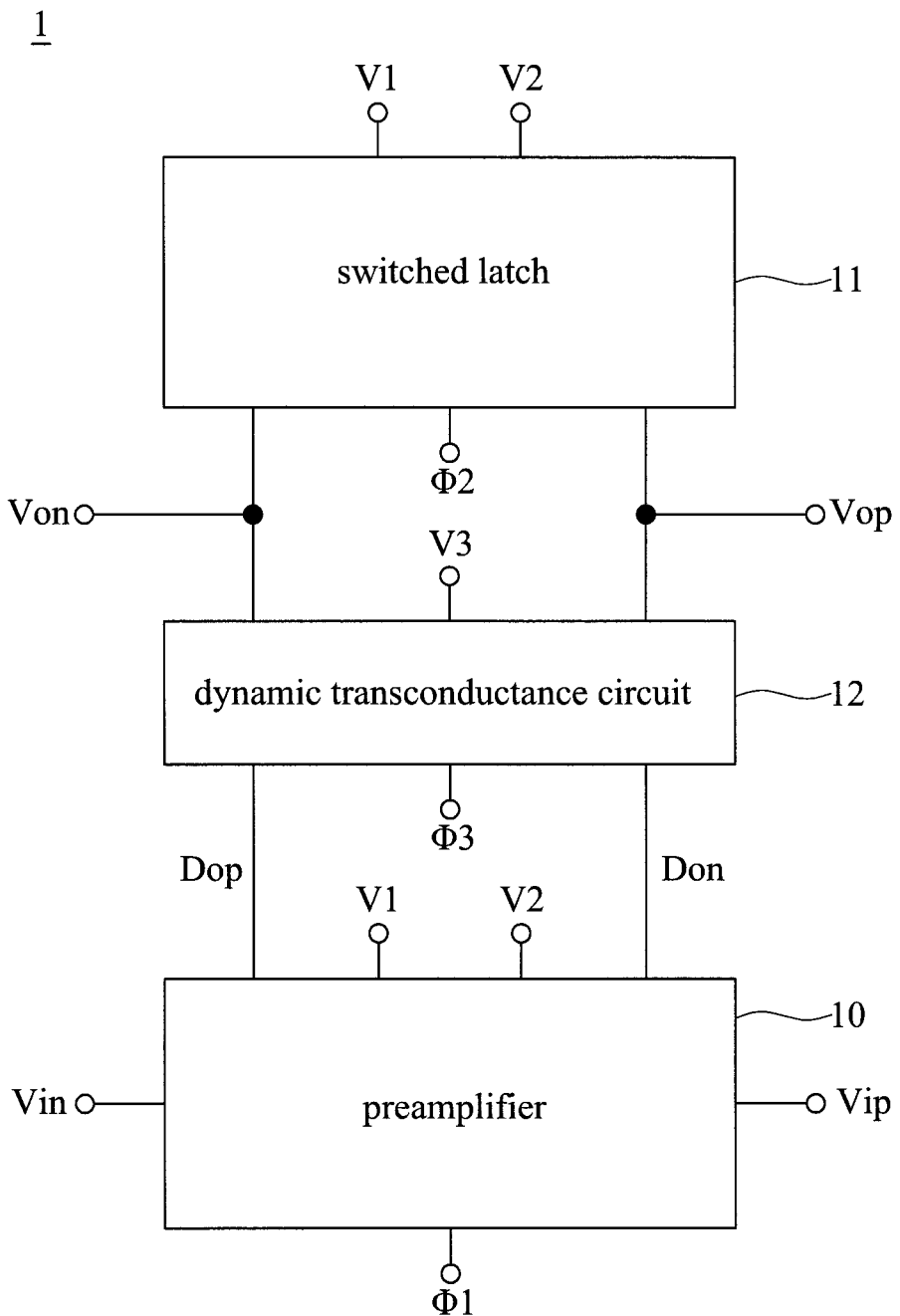
FIG. 1 is a functional block diagram of a dynamic comparator with equalization function of an embodiment in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, a schematic diagram depicting the system of a dynamic comparator 1 with equalization function in accordance with the present disclosure is shown. The dynamic comparator 1 compares two input voltages and generates an output signal as the comparison result of the dynamic comparator 1. The power consumption and operating speed of the dynamic comparator 1 are improved by a dynamic transconductance circuit with equalization function in the present disclosure. The dynamic comparator 1 includes a preamplifier 10, a switched latch 11, and a dynamic transconductance circuit 12.

The preamplifier 10 is used to amplify at least two input signals received to generate output signals for next stage. More specifically, the preamplifier 10 receives input signals. The number of the input signals may be at least two or more; the present disclosure is not limited as such. In an embodiment, the sources of the input signals are input terminals Vin and Vip shown in FIG. 1. The preamplifier 10 is used to amplify input signals to enhance the accuracy of the comparator.

The switched latch 11 is used to perform signal regeneration. More specifically, the switched latch 11 generates output signals based on transconductance signals generated by the dynamic transconductance circuit 12, and the output signals are the comparison result of the comparator. For example, output terminals Von and Vop shown in FIG. 1 generate the output signals.

The dynamic transconductance circuit 12 is inserted between the preamplifier 10 and the switched latch 11 for operating in the reset mode or the comparison mode. When operating in the reset mode, the dynamic transconductance circuit 12 is used in conjunction with the switched latch 11 to perform voltage equalization of the output signals of the switched latch 11, whereas when operating in the comparison mode, the dynamic transconductance circuit 12 is used in conjunction with the switched latch 11 perform signal transconductance based on the input signals of dynamic transconductance circuit 12 provided by the preamplifier 10. More specifically, the dynamic transconductance circuit 12 can be switched between the reset mode and the comparison mode. Before comparison, the dynamic transconductance circuit has to be switched to the reset mode. In the reset mode, the dynamic transconductance circuit 12 combines with the switched latch 11 to perform voltage equalization of the output signals of the switched latch 11, whereas entering comparison, the dynamic transconductance circuit 12 is switched from the reset mode to the comparison mode. In the comparison mode, the dynamic transconductance circuit 12 combined with the switched latch 11 performs signal transconductance based on the input signals of dynamic transconductance circuit 12 provided by the preamplifier 10. The reset mode and the comparison mode of the dynamic comparator will be further described later.

In FIG. 1, before the dynamic comparator 1 making a comparison, the dynamic transconductance circuit 12 has to be switched to the reset mode in order to reduce the interference of the previous state on the following comparison. That is, the bias voltages of the two output signals of the switched latch 11 are equalized to a balanced state. The equalization described here means that the bias voltages of the two output signals of the switched latch 11 are equalized through the mechanism of charge sharing based on a voltage difference between the two outputs of the switched latch 11 generated in the last comparison result of the dynamic comparator 1.

As for comparator architecture without the equalization function, in the reset mode, the traditional approach is to charge or discharge the two output terminals of the comparator to positive or negative supply level of the power supply using a pull-high or a pull-low reset switch, so as to reset the output terminals of the comparator to the positive electrode or the negative electrode of a power supply, thus requiring extra dynamic power consumption. Similarly, as for comparator architecture with static equalization function, in the reset mode, it needs to provide DC path for the static equalization. However, it requires extra static power consumption.

In an embodiment, the dynamic comparator 1 is provided with dynamic equalization function. The operation principle is based on voltage difference in the last comparison result generated at the two output terminals of the comparator as a precondition for performing the equalization. Once the comparator is in the reset mode, the dynamic transconductance circuit 12 turns off its tail current, and forms an equalizer. According to the charge conservation law, the voltages on the two output terminals of the dynamic comparator 1 start equalization between the two output terminals. There is no extra static current. Therefore, the total power consumption can be reduced to achieve the goal of energy efficiency.

In reset mode, for example, a comparator without equalization function needs to reset the two output terminals to the positive or negative electrode of the power supply through charging or discharging. If the two output terminals of the comparator are respectively 1V and 0V in the last comparison result. This reset process consumes extra dynamic power.

On the contrary, the dynamic comparator 1 of an embodiment resets the two output terminals into an equalization state based on dynamic equalization. For example, when the comparator entering the reset mode, assuming the capacitors on the output terminals of the comparator are equal and there is no extra leakage current path. Meanwhile, the capacitor on one of output terminals charged to 1V and the other output terminal charged to 0V. According to the charge conservation law, the both output terminals are setting to 0.5V finally. In this case, there is no extra dynamic power consumption.

When the dynamic comparator 1 is to make a comparison, the dynamic transconductance circuit 12 is then switched from the reset mode to the comparison mode. At this time, the dynamic transconductance circuit 12 is switched to transconductance function, i.e. converting voltage into current, and is used in conjunction with the switched latch 11 to carry out the signal regeneration. Thus, when the comparator enters into the comparison mode, it requires less recovery time to go back to the output common-mode voltage point of the comparator before performing the signal regeneration.

In comparison, the comparator architecture without equalization function, when entering into the comparison mode, has to recover the two output terminals previously reset to the positive or negative electrode of the power supply to a predetermined output common-mode voltage of the comparator before signal generation. Thus, it requires a longer recovery time. On the contrary, in an embodiment, the output terminals are already biased to an equalization state under the reset mode. This equalization state is a voltage between the supply voltages, thus when entering into the comparison mode, the recovery time for pulling to an output common-mode voltage will be shorter than that required by the comparator without equalization function. Therefore, it helps to increase the operating speed of the comparator.

Figure 2:
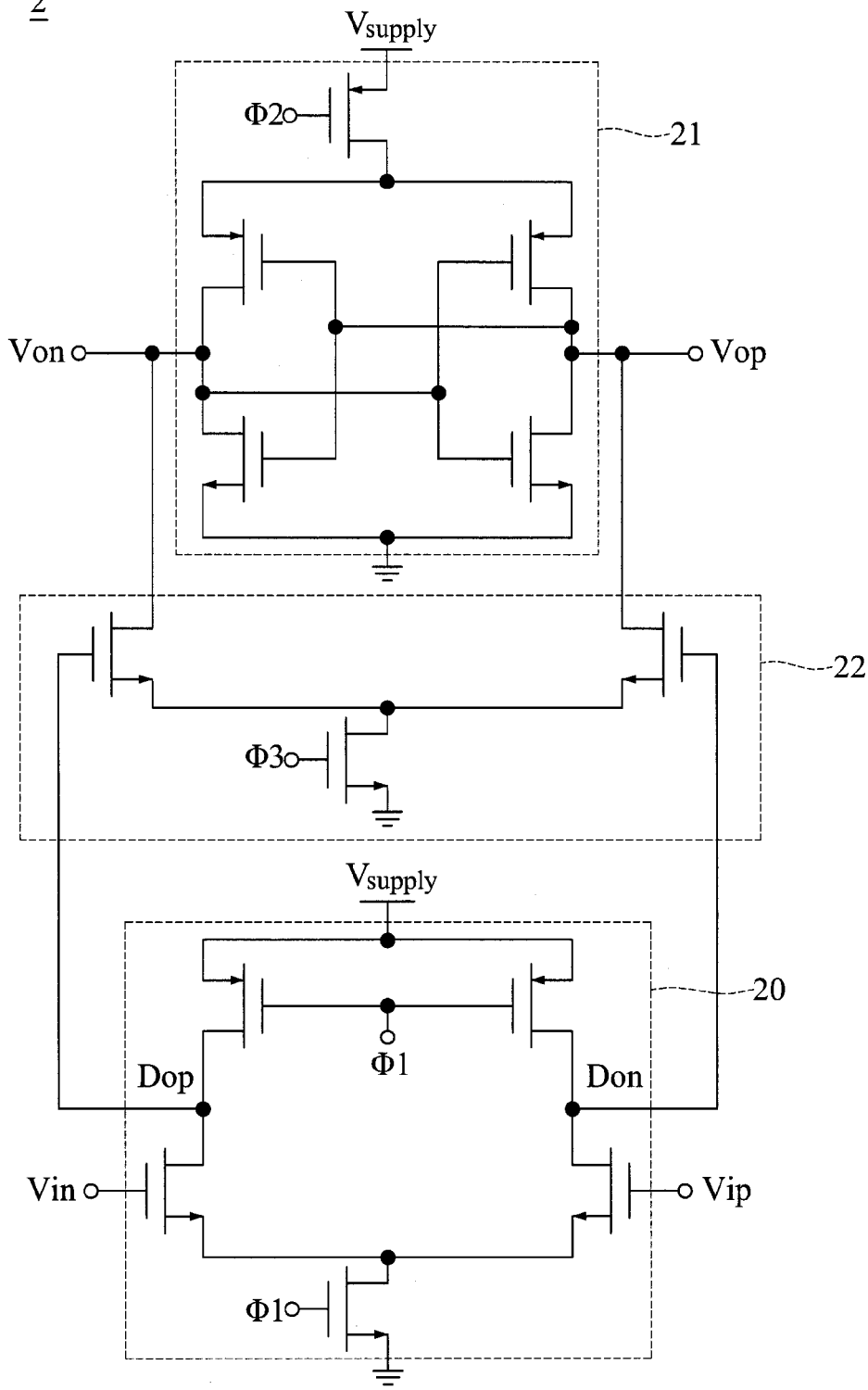
FIG. 2 is a circuit diagram of a dynamic comparator with equalization function of an embodiment in accordance with the present disclosure.

The dynamic comparator 1 is controlled by a set of clock control signals, Φ1-Φ3 to determine whether to switch to the reset mode. In other words, the dynamic comparator 1 determines whether it should be in the reset mode or the comparison mode based on the clock control signals, so control of modes can be achieved by setting the clocks. As shown in FIG. 2, a circuit diagram depicting an implementation of the comparator with equalization function in accordance with the present disclosure is shown. In an embodiment, the dynamic comparator 2 includes a preamplifier 20, a switched latch 21 and a dynamic transconductance circuit 22, each of which are similar to those described with reference to FIG. 1. The dynamic transconductance circuit 22 includes a transistor as a control switch, such as one shown at the clock control signal Φ3, which is to be turned off when in the reset mode. Meanwhile, the clock control signal Φ1 resets the outputs of the preamplifier 20 to "$V_{supply}$", and the transistor controlled by the clock control signal Φ2 is turned off, so that the two output terminals Von and Vop are equalized through two conducting transistors. Alternatively, when in the comparison mode, the transistor of the dynamic transconductance circuit 22 is turned on by the clock control signal Φ3 in order to carry out transconductance. It should be noted that the dynamic transconductance circuit 22 of an embodiments uses the transistor as a control mechanism, but the control mechanism is not limited to transistors; switches or elements with transconductance function can be used as the dynamic transconductance circuit of the present disclosure. From the above, it can be seen that the transistor at the clock control signal Φ3 is able to switch the dynamic transconductance circuit 22 between equalization function and transconductance function. Next, circuit operations of the dynamic comparator in the reset mode and the comparison mode are described with reference to FIGS. 3A and 3B, which are schematic diagrams illustrating circuit operations of the dynamic comparator under different operation modes.

Figure 3A:
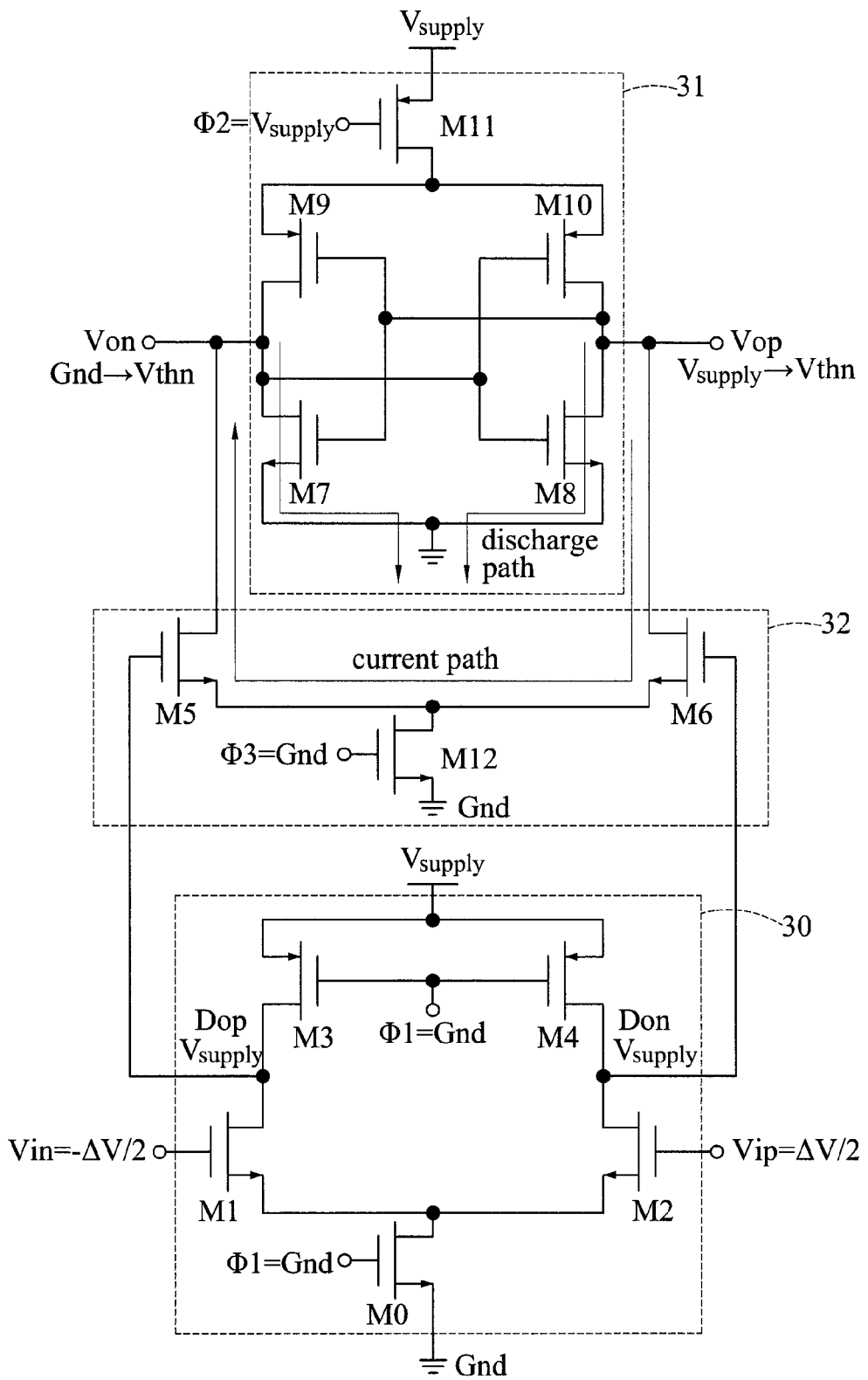
FIGS. 3A and 3B depict the operations of the dynamic comparator in different operation modes in accordance with the present disclosure.

FIG. 3A illustrates controlling the comparator to enter into the reset mode using the clock control signals Φ1-Φ3, which in turn changes the states of transistors M1-M12. First of all, assuming the results from the last comparison mode of the two output terminals Von and Vop of the dynamic comparator are Gnd and $V_{supply}$, respectively. When the comparator enters the reset mode, assuming the gate voltage Vip of the transistor M2 in the preamplifier is ΔV/2, the gate voltage Vin of the transistor M1 is -ΔV/2, the clock control signal Φ1 is Gnd, the clock control signal Φ2 is $V_{supply}$, and the clock control signal Φ3 is Gnd. In other words, the clock control signal Φ1 turns on the transistor M3 and M4 in the preamplifier 30, and turns off the transistor M0. As such, the transistor M1 and M2 are also turned off so that the outputs of the preamplifier 30, Dop and Don, reset to $V_{supply}$. In the meantime, in the dynamic transconductance circuit 32, the transistor M12 controlled by the clock control signal Φ3 is off, so that the two output terminals Von and Vop of the dynamic comparator are equalized through the two conducting transistors M5 and M6, i.e., positive charges in the output terminal Vop with the higher voltage flows towards the other output terminal Von with the lower voltage, as indicated by the current path shown in FIG. 3A. Finally, the two output terminals Von and Vop achieve an equalization state.

In an embodiment, assuming if there is no leakage current or discharge path, the voltage of the output terminal Vop changes from the original $V_{supply}$ to an equalization voltage of $V_{supply}/2$. Meanwhile, the voltage of the output terminal Von changes from the original Gnd to an equalization voltage of $V_{supply}/2$. As a result, the voltages of these two output terminals are balanced.

However, in actual practice, the transistors M7 and M8 during equalization of the transistors M5 and M6 may create a discharge path, which affects the equalization voltage of the output terminals Vop and Von. For example, when there is no leakage current or discharging path, the equalization voltage of the output terminals Vop and Von should be $V_{supply}/2$. However, if this equalization voltage $V_{supply}/2$ is higher than the threshold voltage $V_{thn}$ of the transistors M7 and M8, then the transistors M7 and M8 will provide a discharge path, as indicated by the discharge path shown in FIG. 3A. For example, when $V_{supply}$ is 1V, the output terminals Vop and Von are ideally at 0.5V after equalization, which is greater than the threshold voltage, assuming $V_{thn}$=0.3V, of the transistors M7 and M8. In this case, the transistors M7 and M8 would provide a discharge path. As a result, the equalization voltage on the output terminals Vop and Von are reduced from the ideal 0.5V to 0.3V. Thus, as shown, with the influence of external leakage current or discharge path, the voltage of the output terminal Vop changes from the original $V_{supply}$ to the threshold voltage $V_{thn}$, and the other output terminal Von similarly changes from the original Gnd to the threshold voltage $V_{thn}$.

Figure 3B:
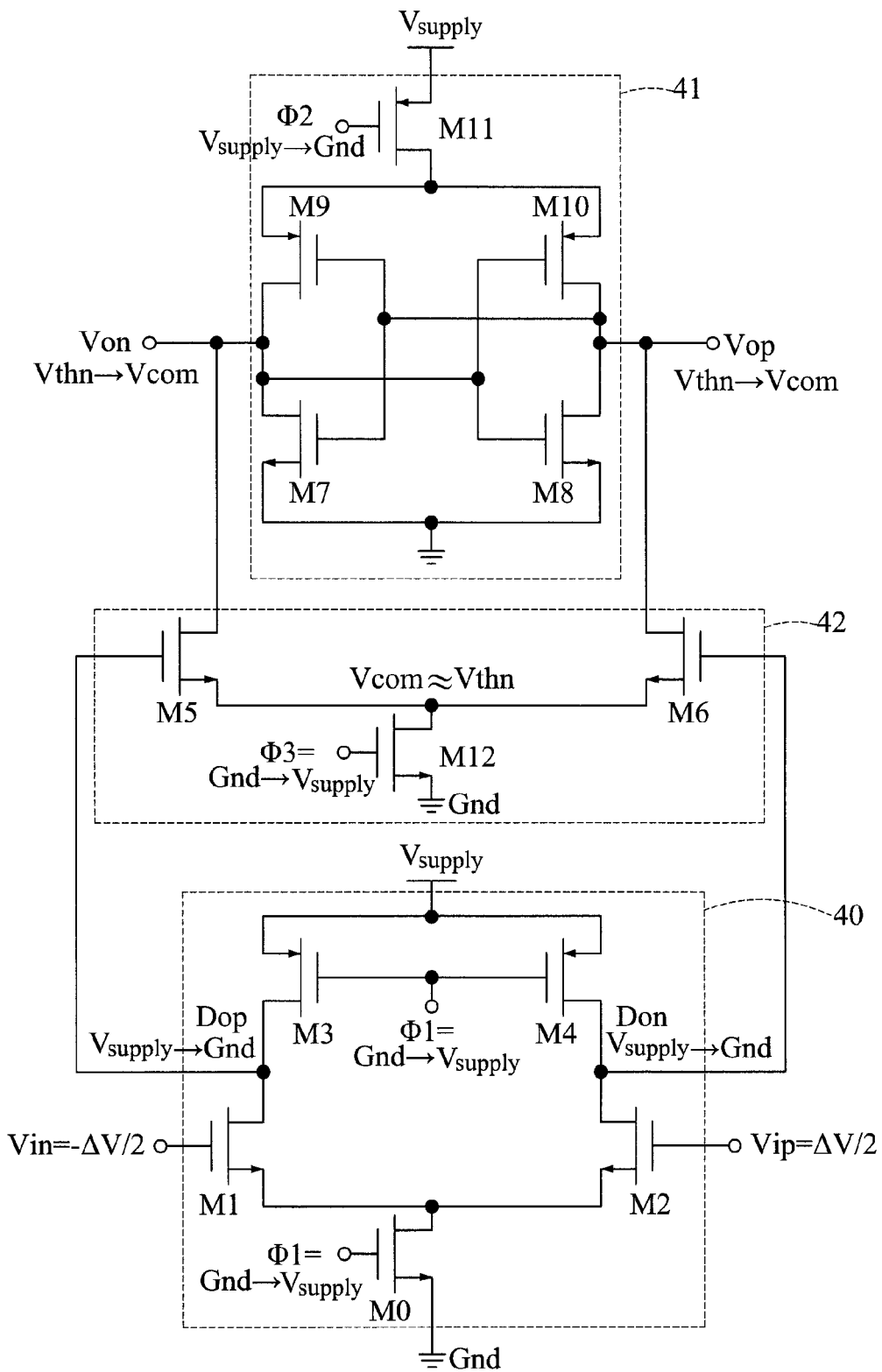

FIG. 3B illustrates controlling the comparator to enter into the comparison mode using the clock control signals Φ1-Φ3, which in turn changes the states of transistors M1-M12. The preamplifier 40 includes two input terminals Vin and Vip. When the gate voltage Vip of the transistor M2 in the preamplifier 40 is ΔV/2, the gate voltage Vin of the transistor M1 is -ΔV/2, the clock control signal Φ1 rises from Gnd to $V_{supply}$, the clock control signal Φ2 in the switched latch 41 falls from $V_{supply}$ to Gnd and the clock control signal Φ3 in the dynamic transconductance circuit 42 rises from Gnd to $V_{supply}$, the dynamic comparator enters into the comparison mode. After the two output terminals Von and Vop of the dynamic comparator are stabilized from $V_{thn}$ to an output common-mode bias point $V_{com}$, signal regeneration can then be performed. Since in the previous reset mode, the voltages of the two output terminals Von and Vop are already stabilized to the threshold voltage $V_{thn}$, which is between $V_{supply}$ and Gnd. When entering into the comparison mode, the two output terminals Von and Vop are stabilized from $V_{thn}$ to the output common-mode bias point $V_{com}$, assuming here $V_{com}=V_{supply}/2$ and $V_{thn}<V_{supply}/2$. In comparison, the dynamic comparator without equalization function, when entering the comparison mode, its two output terminals Von and Vop are stabilized from either $V_{supply}$ or Gnd to the output common-mode bias point $V_{com}$, which requires a longer recovery time. In contrast, the dynamic comparator structure of an embodiment is already equalized to $V_{thn}$ in the reset mode, so it requires less recover time to be stabilized to the output common-mode bias point $V_{com}$.

Thus, by controlling the transistor M12 in the dynamic comparator through the clock control signal Φ3, and in conjunction with the clock control signals Φ1 and Φ2 in the transistor M0 and M11, the dynamic comparator can be switched between the reset mode and the comparison mode, thereby accomplishing operations under different operation modes.

Figure 4:
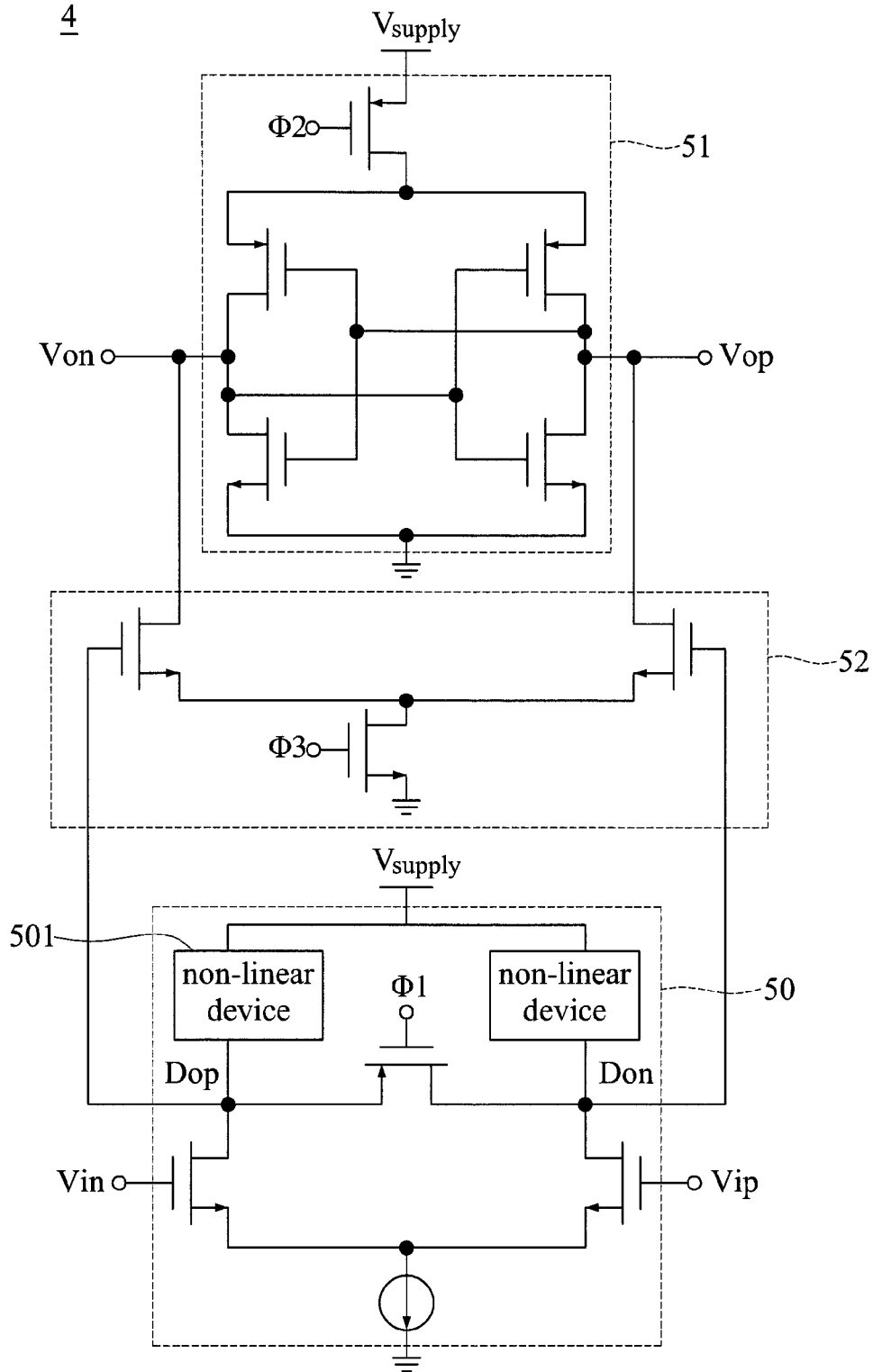
FIG. 4 is a circuit diagram of a dynamic comparator combined with a static preamplifier of an embodiment in accordance with the present disclosure.

Referring to FIG. 4, a circuit diagram depicting another implementation of a dynamic comparator 4 with equalization function in accordance with the present disclosure is shown. A preamplifier 50, a switched latch 51 and a dynamic transconductance circuit 52 of the dynamic comparator 4 with equalization function are similar to those described with reference to FIG. 2. The major difference between an embodiment and that shown in FIG. 2 is that the preamplifier 20 of FIG. 2 is a dynamic preamplifier without equalization function, whereas the preamplifier 50 of the dynamic comparator 4 described in an embodiment is a static preamplifier with equalization function, that is, the preamplifier 50 includes non-linear devices 501 and a equalization switch controlled by the clock control signal Φ1. The static preamplifier of FIG. 4 may control equalization through the clock control signal Φ1. When the transistor controlled by the clock control signal Φ1 is turned on, the static preamplifier performs equalization. Meanwhile, the dynamic transconductance circuit 52 of FIG. 4 is used in conjunction with the switched latch 51 to perform equalization of the two output terminals Vop and Von simultaneously. Thus, the arrangement of FIG. 4 does not affect the goal of achieving a dynamic comparator with dynamic equalization function.

Moreover, the dynamic comparator with dynamic equalization function described in this disclosure not only reduces power consumption and improves operating speed through the equalization mechanism, but the accuracy of the dynamic comparator is not affected by the operations.

More specifically, a traditional comparator with static equalization function usually has an arrangement such that the transistors for equalization function are connected across the two output terminals on the comparator. However, this will create clock feedthrough and charge injection effects when the equalization circuit is disabled, which affects the accuracy of the comparator. In contrast to the traditional comparator, the dynamic comparator of the present disclosure has a dynamic transconductance circuit, wherein the connection between its equalization circuit and the switched latch is not across the two output terminals on the dynamic comparator. As such, in operations, the above two effects can be relieved, thus with the arrangement of the equalization circuit in the present disclosure, the effects of clock feedthrough and charge injection on the comparator can be reduced.

In summary, the present disclosure provides a dynamic comparator with equalization function that, in particular, performs equalization in the reset mode, such that the two output terminals of the dynamic comparator are settling to an equalization state without DC path, thereby reducing static power loss. Moreover, in the comparison mode, it requires less recovery time to settle to the output common-mode voltage before signal regeneration. Thus, the operating speed of the dynamic comparator is enhanced. Furthermore, the arrangement of the equalization circuit in the present disclosure reduces the effects of clock feedthrough and charge injection, thus reducing the influence of the equalization on the accuracy of the dynamic comparator.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A dynamic comparator, comprising:
   a preamplifier for amplifying input signals of the dynamic comparator;
   a switched latch for signal regeneration based on output signals of the preamplifier; and
   a dynamic transconductance circuit inserted between the preamplifier and the switched latch for operating in a reset mode or a comparison mode, wherein when operating in the reset mode, the dynamic transconductance circuit in conjunction with the switched latch performs voltage equalization of output signals of the switched latch, or when operating in the comparison mode, the dynamic transconductance circuit in conjunction with the switched latch receives the output signals generated by the preamplifier and generates transconductance signals,
   wherein the switched latch generates output signals as a comparison result of the dynamic comparator based on the transconductance signals generated by the dynamic transconductance circuit, the switched latch is controlled by a first signal, and the dynamic transconductance circuit is controlled by a second signal different from the first signal.

2. The dynamic comparator of claim 1, wherein when switched to the reset mode, the dynamic transconductance circuit equalizes output terminals of the switched latch to an equalization state.

3. The dynamic comparator of claim 2, wherein the dynamic transconductance circuit equalizes output voltages of the output terminals of the switched latch through a charge sharing mechanism based on a voltage difference between the output signals generated in the last comparison result by the dynamic comparator.

4. The dynamic comparator of claim 1, wherein the dynamic transconductance circuit includes a transistor or a switch controlled by a clock signal for turning off the transistor or switch during the reset mode, so as to equalize the output signals between the output terminals.

5. The dynamic comparator of claim 1, wherein when switched to the comparison mode, the dynamic transconductance circuit provides transconductance function by converting voltage into current in order to perform signal regeneration with the switched latch.

6. The dynamic comparator of claim 1, wherein the dynamic comparator determines whether to switch to the reset mode or the comparison mode through a set of clock control signals received.

7. The dynamic comparator of claim 1, wherein the preamplifier is a dynamic preamplifier or a static preamplifier.

8. The dynamic comparator of claim 7, wherein the static preamplifier includes non-linear devices.

* * * * *